United States Patent [19]

Sano et al.

[11] 4,247,621
[45] Jan. 27, 1981

[54] ORIGINAL PATTERN PLATE OBTAINED BY USE OF PHOTO-SENSITIVE RESIN COMPOSITION

[75] Inventors: Takezo Sano, Takatsuki; Tadanori Inoue, Ibaraki; Yukikazu Uemura, Amagasaki; Akihiro Furuta, Takatsuki, all of Japan

[73] Assignee: Sumitomo Chemical Company, Limited, Osaka, Japan

[21] Appl. No.: 670,956

[22] Filed: Mar. 26, 1976

[30] Foreign Application Priority Data

Mar. 26, 1975 [JP] Japan ................................ 50/37258

[51] Int. Cl.$^3$ ............................................. G03C 1/70
[52] U.S. Cl. ...................................... 430/269; 430/306; 430/307; 430/330; 430/322; 430/281; 430/285; 430/917; 430/920
[58] Field of Search ..................... 96/115, 115 P, 35.1; 430/269, 920

[56] References Cited

U.S. PATENT DOCUMENTS

| 2,760,863 | 8/1956 | Plambeck, Jr. ..................... 96/35.1 |
| 3,595,664 | 7/1971 | Rust .................................. 96/115 R |

Primary Examiner—John D. Welsh
Attorney, Agent, or Firm—Birch, Stewart, Kolasch & Birch

[57] ABSTRACT

An original pattern plate obtained by the use of a photo-sensitive resin composition comprising:
(A) an unsaturated polyester having an acid value of from 10 to 40 and having not less than 50% by mole of unsaturated acids in the acid component,
(B) a photo-polymerizable, ethylenically unsaturated compound which essentially contains a compound having a photo-polymerizable, ethylenically unsaturated linkage and at least one hydroxyl group,
(C) a melamine compound of the formula:

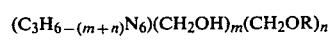

$$(C_3H_{6-(m+n)}N_6)(CH_2OH)_m(CH_2OR)_n$$

wherein R is an alkyl group having 1 to 4 carbon atoms, m is from 0 to 6, n is from 0 to 6 and m+n is from 1.5 to 6, or its condensate having an average condensation degree of not more than 4,
(D) a photo-polymerization initiator, and
(E) a thermal polymerization inhibitor,
the weight proportion of the components (A), (B) and (C) satisfying the relationships of the following equations: $1/5 \leq B/(A+B) \leq 3/5$ and $1/50 \leq C/(A+B+C) \leq 1/5$, which is improved in mechanical strength, particularly in resistance to heat and pressure.

11 Claims, No Drawings

ORIGINAL PATTERN PLATE OBTAINED BY USE OF PHOTO-SENSITIVE RESIN COMPOSITION

BACKGROUND AND SUMMARY OF THE INVENTION

The present invention relates to a photo-sensitive resin composition and its use. More particularly, it relates to a photo-sensitive resin composition, and a photo-sensitive resin plate and an original pattern plate manufactured therewith.

Original pattern plates obtained by the use of photo-sensitive resin compositions are superior to those made of metals in working environment and weigh, and they have become to be used in a wide range of application. Particularly, in the field of mass-printing by a reproduction form, as in newspaper offices, it is desired to replace the existing original pattern plates made of metals by pattern plates. However, they are sometimes inferior in mechanical strength such as resistance to heat and pressure.

Previously, the present inventors provided an excellent photo-sensitive resin composition suitable for the manufacture of original pattern plates [Japanese Patent Application No. 64698/1972]. As a result of the subsequent study, it has now been found that a photo-sensitive resin composition incorporated with a certain thermal condensing material can provide a cured product improved in mechanical strength when cured by photo-hardening and heat-hardening and is thus quite suitable for the manufacture of original pattern plates.

The photo-sensitive resin composition of the present invention comprises:
(A) an unsaturated polyester having an acid value of from 10 to 40 and having not less than 50% by mole of unsaturated acids in the acid component,
(B) a photo-polymerizable, ethylenically unsaturated compound which essentially contains a compound having a photo-polymerizable, ethylenically unsaturated linkage and at least one hydroxyl group,
(C) a melamine compound of the formula:

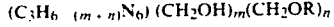

wherein R is an alkyl group having 1 to 4 carbon atoms, m is from 0 to 6, n is from 0 to 6 and m+n is from 1.5 to 6, or its condensate having an average condensation degree of not more than 4,
(D) a photo-polymerization initiator, and
(E) a thermal polymerization inhibitor,
the weight proportion of the components (A), (B) and (C) satisfying the relationships of the following equations: $1/5 \leq B/(A+B) \leq 3/5$ and $1/50 \leq C/(A+B+C) \leq 1/5$.

The unsaturated polyester used as the component (A) is the condensation product of an unsaturated dicarboxylic acid, a saturated dicarboxylic acid and a polyhydric alcohol, which has an acid value of 10 to 40, preferably of 15 to 30. The term "acid value" as herein used is intended to mean the amount as indicated in milligram(s) of potassium hydroxide required to neutralize 1 gram of the unsaturated polyester. When the acid value is too high, the cured product obtained from the resulting composition does not have a sufficient mechanical strength to be used as an original pattern plate to which a high pressure or a high temperature is applied. When the acid value is too low, the resulting composition is apt to undertake gelation during storage and becomes so viscous so as to make the handling thereof troublesome.

Examples of the unsaturated dicarboxylic acid are maleic acid, fumaric acid, itaconic acid and citraconic acid, and their anhydrides (e.g. maleic anhydride, citraconic anhydride). As the saturated dicarboxylic acid, there may be exemplified phthalic acid, isophthalic acid, terephthalic acid, succinic acid, adipic acid, norbornanedicarboxylic acid and tetrahydrophthalic acid, and their anhydrides (e.g. terephthalic anhydride, tetrahydrophthalic anhydride). From each of the unsaturated dicarboxylic acid and the saturated dicarboxylic acid, one or more may be selected and used. A molar ratio of the unsaturated dicarboxylic acid to the saturated dicarboxylic acid is required to be 1 or more, preferably 2 or more. When the molar ratio is less than 1, the curing rate of the resulting composition becomes too slow, and the resultant cured product does not have a mechanical strength enough to make a matrix thereon at an elevated temperature under a high pressure.

Examples of the polyhydric alcohol include a compound of the formula:

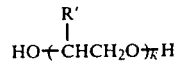

wherein R' is hydrogen or methyl and k is an integer of 1 to 10, a compound of the formula: $HO\text{-}(CH_2)_l\text{-}OH$ wherein l is an integer of 1 to 5, neopentyl glycol, bishydroxyethyl terephthalate, cyclohexanedimethanol, hydrogenated bisphenol A, glycerol, pentaerythritol, etc. There may be used alone or in combination. Among these polyhydric alcohols, particularly preferred is the one of the formula:

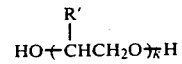

wherein R' is hydrogen or methyl and k is an integer of 2 to 4, since the resulting composition is developable easily with an aqueous solution or the cured product therefrom assures a mechanical strength sufficiently tolerable to the pressing at an elevated temperature under a high pressure.

As the component (B), a compound having a photo-polymerizable, ethylenically unsaturated linkage and at least one hydroxyl group is used as essential. Together with and in addition to this compound, there may be used a compound having a photo-polymerizable, ethylenically unsaturated linkage as optional. Examples of the said essential compound are 2-hydroxyethyl acrylate, 2-hydroxypropyl acrylate, glycerol monoacrylate, glycerol diacrylate, pentaerythritol monoacrylate, pentaerythritol diacrylate, pentaerythritol triacrylate, diethylene glycol monoacrylate, triethylene glycol monoacrylate, 2-hydroxyethyl methacrylate, 2-hydroxypropyl methacrylate, glycerol monomethacrylate, glycerol dimethacrylate, pentaerythritol monomethacrylate, pentaerythritol dimethacrylate, pentaerythritol trimethacrylate, diethylene glycol monomethacrylate, triethylene glycol monomethacrylate, methylolacrylic amide, etc. In order to keep the viscosity of the resulting composition below 10,000 cps at 20° C. and preferably in a range of from 5,000 to 500 cps at 20° C., which may assure the convenience on the manufacture of a cured product useful as an original pattern plate, preferred are 2-hydroxyethyl acrylate, 2-hydroxyethyl methacrylate, diethylene glycol monoacrylate, 2-hydroxyethyl methacrylate, 2-hydroxypropyl methacrylate, diethylene glycol monomethacrylate, etc. Examples of the said optional compound are acrylic acid, methacrylic acid, acrylic amide, methacrylic amide, ethylene glycol diacrylate, diethylene glycol diacrylate, triethylene glycol diacrylate, ethylene glycol dimethacrylate, diethylene glycol dimethacrylate, triethylene glycol dimethacrylate, trimethylolpropane triacrylate, trimethylolpropane trimethacrylate, glycerol triacrylate, glycerol trimethacrylate, pentaerythritol tetraacrylate, pentaerythritol tetramethacrylate, styrene, vinyl toluene, divinyl benzene, vinylpyrrolidone, etc. The essential compound may be used in an amount of not less than 20% by weight, preferably of not less than 50% by weight based on its combined amount with the optional compound. The weight proportion of the component (B) comprising the essential compound, if used, with the optional compound to the unsaturated polyester as the component (A) is required to satisfy the relationship of the following equation: $1/5 \leq B/(A+B) \leq 3/5$, favorably of the following equation: $3/10 \leq B/(A+B) \leq 2/5$. In case of the weight proportion being not within the said relationship, the resulting composition becomes too high in viscosity or the cured product therefrom is made insufficient in mechanical strength, thus causing heat deformation or breaking therein when an elevated temperature or a high pressure is applied thereto in the manufacture of a matrix.

As the component (C), there is used a melamine compound of the formula:

$$(C_3H_{6-(m+n)}N_6)(CH_2OH)_m(CH_2OR)_n$$

wherein R, m, n and m+n are each as defined above, or its condensate having an average condensation degree of 4 or less. Specific examples of the component (C) are hexamethoxymethylmelamine, hexabutoxymethylmelamine, etc. The component (C) reacts with the hydroxyl and carboxyl groups in the component (A) or with the hydroxyl groups in the component (B) on heating, thereby serving to produce the cured product extremely superior to those obtained by photo-polymerization alone in mechanical strength. The weight proportion of the component (C) to the components (A) and (B) is required to satisfy the relationship of the equation: $1/50 \leq C/(A+B+C) \leq 1/5$, preferably of the equation: $1/30 \leq C/(A+B+C) \leq 1/10$. When the weight proportion is larger than the upper limit, the cured product from the resulting composition is strong and hard but is very brittle. When it is smaller than the lower limit, no improvement in the mechanical strength of the cured product is produced.

Examples of the photo-polymerization initiator as the component (D) are α-carbonyl alcohols (e.g. benzoin, α-methylbenzoin, α-phenylbenzoin), α-carbonyl ethers (e.g. benzoin methyl ether, benzoin isopropyl ether), anthraquinones (e.g. sodium anthraquinone-α-sulfonate, 1-chloroanthraquinone, 2-methylanthraquinone, 4-naphthoquinone), etc. The amount of the photo-polymerization initiator may be from 0.1 to 10% by weight based on the total amount of the components (A), (B) and (C).

Examples of the thermal polymerization inhibitor as the component (E) are hydroquinone, methylhydroquinone, tert-butylcatechol, 2,6-di-tert-butyl-p-cresol, etc. The amount of the thermal polymerization inhibitor may be from 0.01 to 1% by weight based on the total amount of the components (A), (B) and (C).

In addition to the above essential components, some other materials may be incorporated as an optional component(s). For instance, the incorporation of p-toluenesulfonic acid in an amount of 1 to 5% by weight may accelerate the thermal condensation, i.e. heat-hardening. Other examples of the optional component are plasticizers (e.g. dibutyl phthalate, dioctyl phthalate), paraffin, glass fibers, calcium carbonate, polyolefin powders, dyes, pigments, etc.

The components as stated above are mixed together and uniformly by the aid of a conventional mixing machine to make a photo-sensitive resin composition, which is then shaped, for instance, in a plate, sheet or layer form, if necessary, on an appropriate support material such as metal plate, glass plate or plastic sheet to make a photo-sensitive resin plate. When the photo-sensitive resin composition has a low viscosity and is fluid, it may be admitted within a frame placed on the support material to make a photo-sensitive resin plate. The thickness of the layer of the photo-sensitive resin composition may be usually from 0.1 to 5.0 mm.

In order to make an original pattern plate, the photo-sensitive resin plate is exposed to actinic light through a negative for photo-polymerization, followed by removal of the non-exposed part to develop an image. The source of actinic light may be a high pressure mercury lamp, an ultra high-pressure mercury lamp, an ultraviolet fluorescent lamp, a carbon arc lamp, a xenon lamp or the like. Subsequently to or simultaneously with the photo-polymerization, thermal condensation may be carried out by heating so as to complete the curing. On the heating, there may be used an electric oven, a drier, an infrared lamp or the like. The temperature and time for the heating depend on the desired physical properties of the cured product and are in general from 120° to 200° C. and from 10 to 60 minutes, respectively.

The original pattern plate prepared through the photo-polymerization and the thermal condensation has a greatly higher mechanical strength than that prepared through the photo-polymerization alone. It is particularly notable that the original pattern plate is highly resistant to heat and pressure and can be used repeatedly for the manufacture of a matrix thereon without any damage.

In addition to the production of the original pattern plate, the photo-sensitive resin composition of the invention may be used for the production of resist materials, printing plates, matrices for reproduction, original patterns for embossing, etc.

Practical and presently preferred embodiments of the present invention are illustratively shown in the following examples wherein parts are by weight.

EXAMPLE 1

A resin composition was obtained by blending 70 parts of the unsaturated polyester (acid value, 23; a condensation product of maleic anhydride, isophthalic acid and triethylene glycol in a molar ratio of 2:1:3), 30 parts of 2-hydroxyethyl methacrylate, 1 part of benzoin isopropyl ether, 0.1 part of hydroquinone and 5 parts of hexamethoxymethylmelamine (Sumimal ® M-100, produced by Sumitomo Chemical Company, Limited).

The resin composition was applied onto an iron plate (420×594 mm) to make a coating layer of 0.6 mm thick, and a negative film supported between a polyester film and a glass plate was placed on the coating layer. The layered product was exposed through the glass plate to a 4 KW high-pressure mercury lamp for 2 minutes, rinsed with an aqueous sodium hydroxide solution to remove the unexposed area and allowed to stand at 160° C. for 30 minutes.

The thus obtained plate as an original pattern plate was covered with a polycarbonate sheet of 2 mm thick and pressed at 200° C. to prepare a matrix. The plate was neither broken nor deformed even after this operation was repeated ten times. Further, the plate was covered with a matrix paper and pressed at 200 kg/cm² at room temperature to give a matrix without rupture or deformation of the plate.

EXAMPLE 2

A resin composition was obtained by blending 60 parts of the unsaturated polyester (acid value, 20; a condensation product of maleic anhydride and triethylene glycol in a molar ratio of 1:1), 40 parts of 2-hydroxyethyl methacrylate, 1 part of benzoin isopropyl ether, 0.1 part of hydroquinone and 5 parts of hexamethoxymethylmelamine (Sumimal® M-100, produced by Sumitomo Chemical Company, Limited). Using the resin composition, an original pattern plate was prepared in the same manner as in Example 1. The original pattern plate was covered with a polycarbonate sheet of 2 mm thick and pressed at 200° C. to prepare a matrix. Even after the preparation of ten pieces of matrix, no breaking was observed on the original pattern plate.

REFERENCE EXAMPLE 1

A resin composition was obtained by blending 70 parts of the same unsaturated polyester as in Example 1, 30 parts of 2-hydroxyethyl methacrylate, 1 part of benzoin isopropyl ether and 0.1 part of hydroquinone. Using the resin composition, an original pattern plate was prepared in the same manner as in Example 1. The original pattern plate was covered with a polycarbonate sheet and pressed at 200° C. to prepare a matrix. After the preparation of five pieces of matrix, the fine lines of the original pattern plate were partially broken. Further, on preparing a paper matrix in the same manner as in Example 1, the original pattern plate was deformed and partially broken and the lines of the paper matrix were not sharp.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for preparing an original pattern plate which comprises exposing a photo-sensitive resin plate comprising a support material and a layer of a photo-sensitive resin composition consisting essentially of:
    (A) an unsaturated polyester having an acid value of from 10 to 40 and having not less than 50% by mole of unsaturated acids in the acid component;
    (B) a photo-polymerizable, ethylenically unsaturated compound which essentially contains a compound having a photo-polymerizable, ethylenically unsaturated linkage and at least one hydroxyl group;
    (C) a melamine compound of the formula:

$(C_3H_{6-(m+n)}N_6)(CH_2OH)_m(CH_2OR)_n$ wherein R is an alkyl group having 1 to 4 carbon atoms, m is from 0 to 6, n is from 0 to 6, and m+n is from 1.5 to 6, or its condensate having an average condensation degree of not more than 4;
    (D) a photo-polymerization initiator; and
    (E) a thermal polymerization inhibitor, the weight proportions of the components (A), (B), and (C) satisfying the relationships of the following equations:

$1/5 \leq B/(A+B) \leq 3/5$ and $1/50 \leq C/(A+B+C) \leq 1/5$, to actinic light through a negative, removing the non-exposed part therefrom to develop an image, followed by keeping the resultant plate at a temperature under which heat-hardening proceeds.

2. The process according to claim 1, wherein the unsaturated polyester is the one obtained by condensation of an unsaturated dicarboxylic acid, a saturated dicarboxylic acid and a polyhydric alcohol.

3. The process according to claim 2, wherein the molar ratio of the unsaturated dicarboxylic acid to the saturated dicarboxylic acid is 1 or more.

4. The process according to claim 2, wherein the unsaturated dicarboxylic acid is at least one selected from the group consisting of maleic acid, fumaric acid, itaconic acid and citraconic acid, and their anhydrides.

5. The process according to claim 2, wherein the saturated dicarboxylic acid is at least one selected from the group consisting of phthalic acid, isophthalic acid, terephthalic acid, succinic acid, adipic acid, norbornanedicarboxylic acid and tetrahydrophthalic acid, and their anhydrides.

6. The process according to claim 2, wherein the polyhydric alcohol is a compound of the formula:

wherein R' is hydrogen or methyl, and k is an integer of 1 to 10, a compound of the formula: $HO(CH_2)_lOH$ wherein l is an integer of 1 to 5, neopentyl glycol, bishydroxyethyl terephthalate, cyclohexane dimethanol, hydrogenated bisphenol A, glycerol or pentaerythritol, or their mixtures.

7. The process according to claim 6, wherein the polyhydric alcohol is

wherein R' is hydrogen or methyl and k is an integer of 2 to 4.

8. The process according to claim 1, wherein the compound having a photo-polymerizable, ethylenically unsaturated linkage and at least one hydroxyl group is at least one selected from the group consisting of 2-hydroxyethyl acrylate, 2-hydroxypropyl acrylate, glycerol monoacrylate, glycerol diacrylate, pentaerythritol monoacrylate, pentaerythritol diacrylate, pentaerythritol triacrylate, diethylene glycol monoacrylate, triethylene glycol monoacrylate, 2-hydroxyethyl methacrylate, 2-hydroxypropyl methacrylate, glycerol monomethacrylate, glycerol dimethacrylate, pentaerythritol monomethyacrylate, pentaerythritol dimethacrylate, pentaerythritol trimethyacrylate, diethylene glycol monomethacrylate, triethylene glycol monomethacrylate and methylolacrylic amide.

9. The process according to claim 1, wherein the melamine compound is hexamethoxymethylmelamine or hexabutoxymethylmelamine.

10. An original pattern plate prepared by the process of claim 1.

11. The process according to claim 1, wherein the unsaturated polyester has an acid value of 10 to 40.

* * * * *